United States Patent [19]

Graham

[11] 4,132,903
[45] Jan. 2, 1979

[54] CCD OUTPUT CIRCUIT USING THIN FILM TRANSISTOR

[75] Inventor: Scott O. Graham, Sunnyvale, Calif.

[73] Assignee: RCA Corporation, New York, N.Y.

[21] Appl. No.: 796,417

[22] Filed: May 12, 1977

[51] Int. Cl.$^2$ .............. G11C 19/28; H01L 29/78; H01L 49/02; H01L 29/04
[52] U.S. Cl. .................. 307/221 D; 357/4; 357/23; 357/24; 357/59
[58] Field of Search ............ 357/4, 24, 59, 23; 307/221 D, 304

[56] References Cited

U.S. PATENT DOCUMENTS

| | | | |
|---|---|---|---|
| 3,623,132 | 11/1971 | Green | 357/24 |
| 3,918,070 | 11/1975 | Shannon | 357/24 |
| 3,943,545 | 3/1976 | Kim | 357/24 |

Primary Examiner—William D. Larkins
Assistant Examiner—Gene M. Munson
Attorney, Agent, or Firm—H. Christoffersen; Samuel Cohen

[57] ABSTRACT

Compact, low-capacitance output circuit for charge coupled device (CCD). The circuit includes a semiconductor electrode which is doped at opposite edges thereof to form the source and drain regions, respectively, of a thin film transistor. The conduction channel of the transistor is the region of the semiconductor electrode between the source and drain regions. The gate electrode of the transistor is the region of the substrate adjacent to the conduction channel and the input signals comprise the packets of charge shifted to this substrate region by the multiple phase voltages which operate the CCD.

8 Claims, 6 Drawing Figures

CCD OUTPUT CIRCUIT USING THIN FILM TRANSISTOR

The present invention relates to charge-coupled devices (CCD's) and particularly to output circuits therefor.

The capacitance which is present at the output signal pick-up point of a CCD affects the output signal level. Typically, substrate surface potentials are available at this point in the one-to-five volt range. However, there is capacitive voltage division which occurs which may reduce the actual output voltage obtained by a factor of ten or more—to 100 to 500 millivolt as an example. This division occurs among capacitive components such as the tap (floating gate or floating diffusion) capacitance, the output transistor gate electrode capacitance, and the capacitance of the conductor which connects the tap to the gate electrode of this output transistor.

It is desirable in the interest of reducing the operating power needed, of increasing the CCD cell packing density and for other reasons to employ cells of small size. When the cell size is reduced, the tap capacitance and the transistor gate capacitance should shrink proportionately but, in practice, this does not occur. Due to certain design rule limitations, the width and length of the conductor connecting the tap to the gate electrode may not be reduced to lower than given values and therefore its capacitance cannot be lowered beyond a given point. Even for relatively wide (say 50 μm) CCD channels, the stray and unnecessary capacitances dominate and it is for this reason that there can be the ten-to-one or more reduction in voltage level mentioned above.

In an output circuit embodying the present invention, the output transistor and the tap mentioned above comprise the same structure, namely one of the CCD gate electrodes. This gate electrode is doped to form source and drain regions with a conduction channel therebetween, the conduction channel being insulated from and immediately adjacent to the surface of the CCD semiconductor substrate. This substrate region operates as the gate electrode of the transistor and charge shifted thereto serves as the input signal to this transistor.

Figure 1:
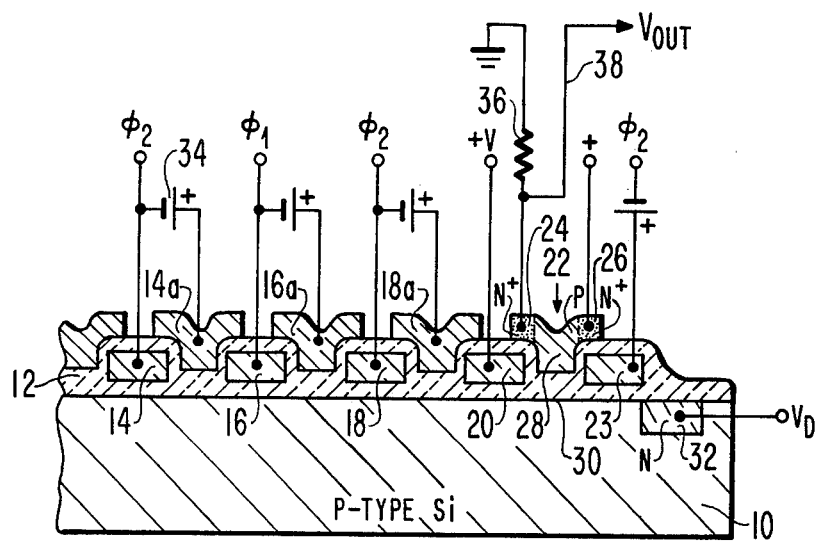
FIG. 1 is a section through a portion of a CCD embodying one form of the present invention.

The CCD of FIG. 1, which is an example of one possible implementation of the invention, includes a P-type silicon substrate 10 and a plurality of polysilicon electrodes which are insulated from the substrate. The insulation 12 may be silicon dioxide and it may be thermally grown or formed in other ways. The electrodes 14, 14a, 16, 16a and so on, are of the two-layer type and all (except 22) may be of the same conductivity type, such as P type.

The output circuit of the CCD comprises electrode 22. It is formed of P-type polysilicon and is doped at the opposite edges thereof to form N+ regions 24 and 26 which are shown stippled. Region 24 serves as the source electrode of a thin film field effect transistor and region 26 serves as the drain electrode of this transistor. The region 28 between source and drain is of P conductivity type and serves as the conduction channel of the thin film transistor. The gate electrode of the transistor comprises the region 30 of the substrate adjacent to the conduction channel 28.

The CCD of FIG. 1 also includes a drain region 32 which may be of N conductivity type and which may be formed as a diffusion in the substrate. It is maintained at a relatively positive voltage level $V_D$.

Figure 3:
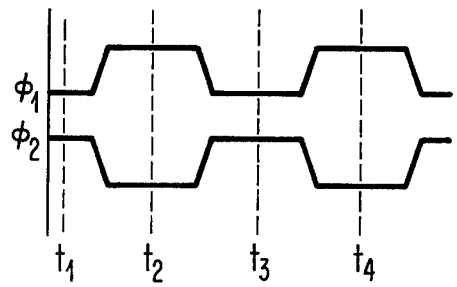
FIG. 3 is a drawing of waveforms employed in the operation of the circuits of FIGS. 1 and 4.

The CCD illustrated is two-phase operated and the two-phase voltages are illustrated at $\phi_1$ and $\phi_2$ in FIG. 3. As is understood in this art, to insure that the charges flow unidirectionally in response to the two phase voltages, the potential wells which are formed in the substrate must be asymmetrical. Such asymmetry is obtained in the present arrangement by operating one electrode such as 14a of each pair of electrodes such as 14, 14a at a higher (more positive) voltage level than the other electrode. This is illustrated schematically in FIG. 1 by showing a battery such as 34 connected between each pair of electrodes for maintaining the a electrode more positive than the other electrode of the pair.

During the operation of the circuit of FIG. 1, electrode 20 is always maintained at a positive DC level $+V$. A positive voltage is also applied to the drain electrode 26 of the transistor. For purpose of illustration, this transistor is shown connected to operate as a source follower, a resistor 36 being connected between the source electrode 24 and a point of reference potential such as ground. The output terminal 38 of the transistor is connected to the source electrode 24 of the transistor.

Figure 2:
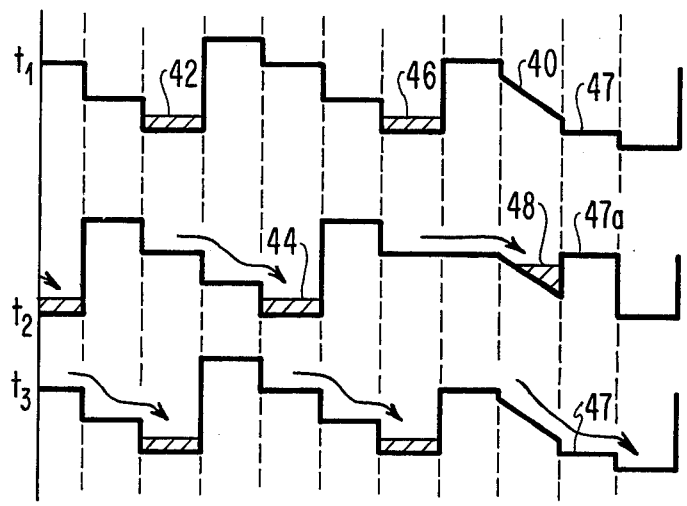
FIG. 2 is a drawing of surface potential profiles to help explain the operation of the CCD of FIG. 1.

The operation of the circuit is depicted in FIG. 2. At time $t_1$, $\phi_2$ is relatively positive and $\phi_1$ is at a reference voltage level. The surface potentials obtained are illustrated at $t_1$ in FIG. 2. It is assumed that charge signals (electrons in this example) are present and they are in the potential wells 42 and 46 beneath electrodes 14a and 18a, respectively. As the drain electrode 26 is more positive than the source electrode 24, there is a voltage gradient in the conduction channel 28 between these electrodes. This establishes a surface potential gradient, shown at 40 in FIG. 2, in the substrate beneath this conduction channel. The drain diffusion 32 is maintained at a potential which is relatively positive and the gate electrode 23 is relatively positive to provide a potential valley 47. Therefore any charge carriers (electrons in the case of the surface-channel, P type substrate device illustrated) which may have been present in substrate region 30 will have passed through this valley to the drain region 32 and conducted away.

At time $t_2$, $\phi_1$ is relatively positive and $\phi_2$ is at the reference level. The charge signal formerly in potential well 42 has traveled to potential well 44 beneath electrode 16a. There is now a potential well 48 which is present in the region 30 of the substrate, the potential barrier 47a beneath electrode 23 defining one boundary of this well. The barrier 47a is present because $\phi_2$ is now relatively low. The charge carriers which formerly were present in potential well 46 have traveled to the potential well 48. This charge, which consists of electrons, affects the impedance of the conduction channel 28 of the thin film output transistor. The transistor can be considered to be an N channel transistor and the electrons present at 30 decrease the conduction through this transistor and therefore decrease the output voltage available at 38. The source follower circuit therefore operates as a non-inverting amplifier in the sense that the greater the amount of charge present at 30, that is, the greater the number of electrons present at 30, the less positive the output voltage produced at 38.

At time $t_3$, $\phi_2$ is relatively positive again and $\phi_1$ is at the reference level. The charge formerly present at 48, propagates via the potential valley 47 now present again beneath electrode 23 to the drain 32 where it is conducted away. As charge is no longer present beneath the conduction channel 28, the thin film transistor returns to its initial quiescent condition. In this condition the transistor conducts more heavily and the voltage present at the output lead 38 is relatively positive.

As mentioned in the introductory discussion, the important advantage of the output circuit just described is that it exhibits relatively low capacitance. As contrasted to the prior art which employs a floating gate electrode or a floating diffusion, and which requires a lead from the floating gate or diffusion to a separate output transistor, in the present circuit the electrode structure 22 itself operates as a transistor.

Figure 4:
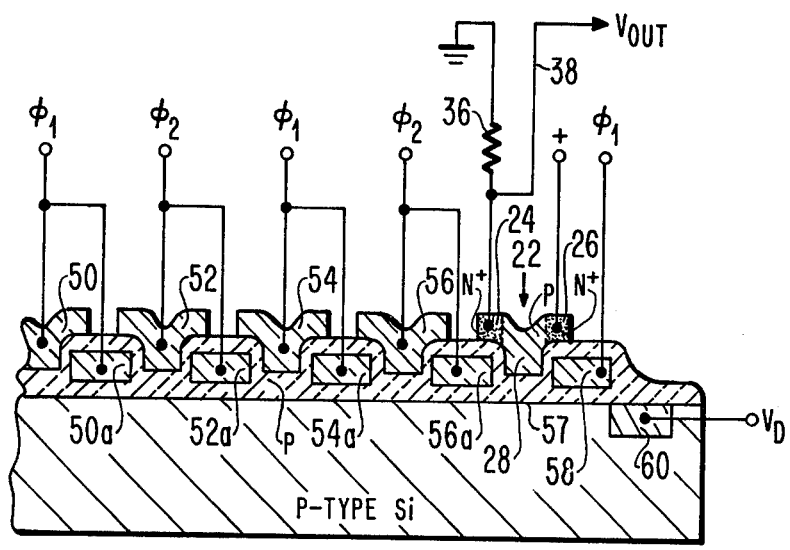
FIG. 4 is a section through a CCD embodying a second form of the present invention.

A second embodiment of the invention is illustrated in FIG. 4. The structure is similar to that of FIG. 1 but the gate electrodes are interconnected in a different way and the mode of operation is different. In the embodiment of FIG. 4, the leading electrodes, that is, the a electrode of each pair is closer to the substrate than the lagging electrode of the pair. The potential well asymmetry of the desired sense may be achieved simply by this difference in spacing from the substrate. The electrode 56a which is closest to the thin film output transistor is operated by a $\phi_2$ voltage rather than being maintained at a constant direct voltage level as in FIG. 1. Further, in the circuit of FIG. 4 the electrode 58 following the thin film transistor is operated by a $\phi_1$ voltage whereas the electrode pair 56, 56a proceeding the thin film transistor is operated by a $\phi_2$ voltage. In the circuit of FIG. 2 this is not the case.

Figure 5:
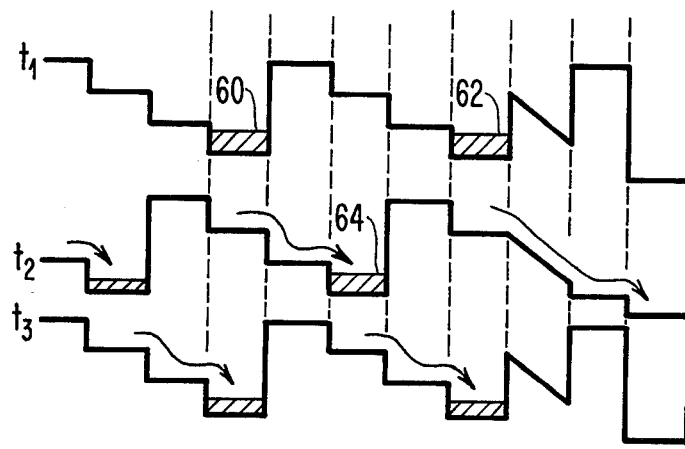
FIG. 5 is a drawing of surface potential profiles to help illustrate the operation of the circuit of FIG. 4.

The operation of the circuit of FIG. 4 is depicted in FIG. 5. At time $t_1$, charge may be present in potential well 60 beneath electrode 52a and in potential well 62 beneath electrode 56a. At time $t_2$, the charge from well 60 has shifted to well 64 beneath electrode 54a and the charge from well 62 has shifted to the drain diffusion 60. In the process of the traveling from well 62 to the drain diffusion, this charge, a packet of electrons, travels through the region 57 of the substrate beneath the conduction channel 28, this region 57 acting as the gate electrode of the thin film transistor. This passage of the charge signal causes a change in the current passing through load resistor 36 and is manifested as a negative-going voltage spike at output lead 38 of the source follower circuit.

Figure 6:
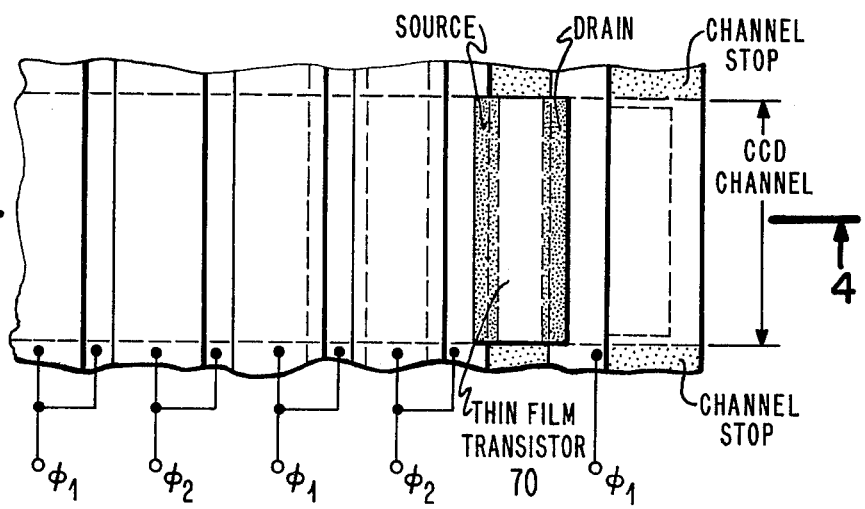
FIG. 6 is a plan view of the circuit of FIG. 4.

FIG. 6 is a plan view of the circuit of FIG. 4. It illustrates the CCD channel and the channel stops employed to define the CCD channel. The thin film output transistor (which comprises the electrode 22 and the substrate region adjacent to its conduction channel 28) is shown at 70, the source and drain regions being illustrated by stippling. Except for the electrical connections, the plan view of FIG. 1 is the same as is shown in FIG. 6.

While the thin film transistor circuit embodying the present invention is shown in FIGS. 1, 4 and 6 as being located at the output end of a CCD register, it is to be appreciated that it can instead be located elsewhere. For example, a number of thin film transistors may be spaced at intermediate points along the length of a CCD register and serve as the means for obtaining multiple outputs from the CCD. An advantage of such an arrangement is that these multiple "taps" exhibit little extra capacitance and occupy the same space that would be occupied by conventional floating gate outputs. Circuits of this kind are useful in filter applications and in pattern matching applications, as examples.

Further, while not illustrated, it is possible to have additional means for controlling the thin film output transistor. Such means may include an additional gate electrode above the conduction channel 28 of the transistor and separated from the conduction channel by a thin insulating film such as one which is thermally grown on the exposed surface electrode 28. This additional means for control, that is, this additional gate electrode may be employed for turning on and off the thin film transistor at appropriate times in the operation, for example in synchronism with the multiple phase voltages. In other words, the output transistor may be maintained off by means of this additional gate electrode except during the times it is desired to sense whether or not a charge signal is present. The disadvantage of such an additional means for control is the introduction of additional capacitance.

The manufacture of a CCD such as described above may be accomplished using well-known techniques. For example, the source and drain regions 24 and 26 may be formed by ion implanting N type impurities into the P type gate electrode. Further, while the electrodes illustrated are formed of polysilicon of give conductivity type such as either N or P conductivity type, it is to be understood that other semiconductor material may be used instead. Further, while two layer, all polysilicon electrodes are shown by way of illustration, the invention is not limited to this structure. Aside from the output transistor, the other electrodes may be formed of metal or one layer of metal and the other of polysilicon. Further, the other electrodes may be of single layer construction or of three layer construction as other examples. Moreover, ion implantation may be employed for creating asymmetrical potential wells, if desired. Further, while two phase CCD's are illustrated, the invention is equally applicable to 3, 4 higher phase CCD's or even to single phase CCD's.

For purposes of illustration, the thin film output transistor is shown connected in a source follower circuit. Other amplifier arrangements can be used instead. For example, the transistor may be operated as a common source amplifier, that is, with its source connected directly to a point of reference potential and its drain connected through a load to the operating voltage source. Further, while the load is shown as a resistor, it can instead be a semiconductor device such as another transistor of the same or of opposite channel conductivity type. In the latter case, the circuit can be considered a complementary transistor inverter circuit.

It is to be understood that the particular dopings shown are given only by way of example. Clearly, the inventive teachings are applicable to CCD's employing N conductivity substrates and to buried channel CCD's and to thin film output transistors formed of N-type polysilicon with P-type source and drain regions, all provided that voltages of suitable polarity are employed. Moreover, the output transistor can be a depletion mode rather than an enhancement mode transistor.

The depletion mode transistor can be of N+NN+ or of P+PP+ type.

The CCD register illustrated may be one which receives electrical inputs supplied, for example, from an input source diffusion or by transfer from another storage medium such as another CCD register. Alternatively, the inputs may be optical inputs obtained by projecting an image onto the substrate either on the back surface or through the electrodes.

While two modes of operation have been described, others are possible. For example, the thin film transistor may be operated in a clocked mode (clock voltage plus bias applied to the drain electrode) along with the CCD electrodes rather than in DC fashion.

What is claimed is:

1. A charge-coupled device comprising:
   a semiconductor substrate;
   multiple electrodes, one adjacent to another, all insulated from the substrate, to which multiple phase voltages may be applied for the storage and propagation of charge signals along the substrate;
   one of said electrodes comprising spaced regions of one conductivity type serving as the source and drain regions of a transistor and a third region of different conductivity type between said spaced regions serving as a conduction channel, said third region being located adjacent to a portion of the substrate, said portion of the substrate serving as the gate electrode of said transistor;
   a load; and
   two terminals for an operating voltage source, one terminal coupled to one of said source and drain regions through said load and the other terminal coupled to said other of said source and drain regions, said transistor being responsive to charge propagated to said portion of the substrate serving as the gate electrode of said transistor, said charge affecting the flow of current through said load.

2. A charge-coupled device as set forth in claim 1 wherein said substrate and third region are of the same conductivity type.

3. A thin-film output transistor circuit for a charge-coupled device employing a substrate and semiconductor electrodes comprising:
   one of said semiconductor electrodes doped at opposite edges thereof to form first and second regions of one conductivity type serving as the source and drain electrodes of said transistor and including a third region of different conductivity type to said first and second regions located between said first and second regions and serving as the conduction channel of said transistor, said third region being adjacent to and insulated from said substrate;
   means for shifting a charge signal to the region of said substrate adjacent to said third region, said charge signal serving as an input signal to said transistor;
   connections at said first and second regions to which operating voltages for said transistor may be applied;
   a load connected to one of said first and second regions through which an operating current flows when said operating voltages are present; and
   output signal terminals connected across said load.

4. A circuit as set forth in claim 3 wherein said electrodes are formed of polysilicon.

5. A circuit as set forth in claim 4 wherein said substrate is formed of silicon and is of the same conductivity type as said third region.

6. A charge coupled device comprising, in combination:
   a semiconductor substrate;
   a layer of first electrodes spaced from one another along the length of the substrate and insulated from he substrate;
   a layer of semiconductor second electrodes, each second electrode lying in the space between a pair of first electrodes, overlapping the edges of these first electrodes, and being spaced both from the substrate and the first electrodes by a thin layer of insulation; and
   one of said second electrodes comprising first and second opposite edge regions of one conductivity type and a third region of different conductivity type than said first and second regions lying between the two and being adjacent to the substrate.

7. A charge coupled device as set forth in claim 6 wherein said substrate and said third region are of the same conductivity type.

8. A charge coupled device as set forth in claim 7 wherein except for said one electrode, all other electrodes of said charge coupled device are formed of semiconductor material of the same conductivity type.

* * * * *